(12) United States Patent
Said et al.

(10) Patent No.: US 8,835,852 B2
(45) Date of Patent: Sep. 16, 2014

(54) SEMICONDUCTOR OPTOELECTRONIC DEVICE

(75) Inventors: Aurore J. Said, Metn (LB); Daniel L. Recht, Cambridge, MA (US); Jeffrey M. Warrender, Averill Park, NY (US); Michael J. Aziz, Concord, MA (US)

(73) Assignees: President and Fellows of Harvard College, Cambridge, MA (US); U.S. Army RDECOM-ARDEC, Washington, DC (US)

( * ) Notice: Subject to any disclaimer, the term of this patent is extended or adjusted under 35 U.S.C. 154(b) by 267 days.

(21) Appl. No.: 13/513,621

(22) PCT Filed: Jan. 7, 2011

(86) PCT No.: PCT/US2011/020488
§ 371 (c)(1),
(2), (4) Date: Jul. 3, 2012

(87) PCT Pub. No.: WO2011/085177
PCT Pub. Date: Jul. 14, 2011

(65) Prior Publication Data
US 2012/0262701 A1    Oct. 18, 2012

Related U.S. Application Data

(60) Provisional application No. 61/293,435, filed on Jan. 8, 2010.

(51) Int. Cl.
G01J 5/20        (2006.01)
H01L 31/068      (2012.01)
H01L 31/0288     (2006.01)
H01L 31/103      (2006.01)
H01L 31/18       (2006.01)

(52) U.S. Cl.
CPC .............. *H01L 31/068* (2013.01); *G01J 5/20* (2013.01); *H01L 31/0288* (2013.01); *H01L 31/103* (2013.01); *H01L 31/1804* (2013.01); *H01L 31/1864* (2013.01); *H01L 31/1872* (2013.01); *Y02E 10/547* (2013.01)
USPC .......................... 250/338.4; 438/95

(58) Field of Classification Search
CPC ........ G01J 5/20; G01J 5/28; H01L 21/02568; H01L 31/0272; H01L 31/0288
USPC ............. 250/338.4, 339.01; 438/102, 795, 95
See application file for complete search history.

(56) References Cited

U.S. PATENT DOCUMENTS

2009/0218493 A1    9/2009   McCaffrey et al.

*Primary Examiner* — Mark R Gaworecki
(74) *Attorney, Agent, or Firm* — Occhiuti & Rohlicek LLP

(57) ABSTRACT

A manufacture having an electrical response to incident photons includes a semiconductor substrate; a chalcogen-doped semiconductor active layer on a first side of the substrate; a first contact in electrical contact with the active layer; and a second contact in electrical contact with the substrate; wherein, photons incident upon the active layer cause a variation in current between the first and second contacts.

21 Claims, 5 Drawing Sheets

SEMICONDUCTOR OPTOELECTRONIC DEVICE

RELATED APPLICATIONS

This application is the national stage of International Application PCT/US2011/020488, filed on Jan. 8, 2011, which claims the benefit of U.S. Provisional Application 61/293,435, filed on Jan. 8, 2010, the contents of which are herein incorporated by reference.

GOVERNMENT RIGHTS

This invention was made with government support under W15QKN-07-P-0092 awarded by U.S. Army Research Laboratory (ARL). The government has certain rights in the invention.

FIELD OF DISCLOSURE

This disclosure relates to semiconductor devices, and in particular, devices that respond to illumination.

BACKGROUND

A key element in an optical communication system is a photodetector. The efficiency of a photovoltaic cell or light detector is measured by a quantity referred to as the "external quantum efficiency." In general, external quantum efficiency is not constant across all wavelengths. In particular, for many photovoltaic and light detecting devices, there is a sharp drop in external quantum efficiency as wavelength surpasses about 1000 nm. Thus, much of this energy cannot be captured for use or detection.

Known silicon photodetectors do not respond efficiently at shorter wavelengths, for example between 700 nm and 900 nm. However, as the wavelength extends past about 1000 nm, the external quantum efficiency of known silicon photodetectors begins to plummet.

A particularly common light source used in optical communication systems is the Nd:Yag laser. This laser outputs a beam at 1064 nm. Unfortunately, known silicon photodetectors do not respond efficiently to photons at such long wavelengths.

To some extent, it is possible to compensate for this lack of efficiency by providing a device having a thicker substrate. However, doing so comes at the cost of increasing response time. A need therefore exists for a photodetecting device with sufficiently external quantum efficiency at infrared wavelengths to avoid the need to have a thicker device, and accordingly, avoids the performance trade-offs associated with such a device.

SUMMARY

In one aspect, the invention features a manufacture having an electrical response to incident photons. Such a manufacture includes a semiconductor substrate; a chalcogen-doped semiconductor active layer on a first side of the substrate; a first contact in electrical contact with the active layer; and a second contact in electrical contact with the substrate; wherein photons incident upon the active layer cause a variation in current between the first and second contacts.

In some embodiments, the active layer is a single-crystal semiconductor. In others, the active layer has a thickness between 50 nm and 500 nm. And in yet others, the active layer is silicon.

In some embodiments, photons incident upon the active layer include infrared photons. In other embodiments, the photons incident upon the active layer have wavelengths above 1050 nm.

Among the embodiments of the manufacture are those in which the active layer is doped with sulfur, those in which the active layer is doped with selenium, those in which the active layer is doped with a combination of sulfur and selenium, and those in which the active layer is doped with different types of atoms.

In yet other embodiments, the manufacture has an active layer doped to have 1 atomic percent of chalcogen atoms. In additional embodiments, the active layer is doped to have in excess of 1 atomic percent of chalcogen atoms. In yet other embodiments, the active layer has a concentration of chalcogen atoms within the range of $10^{18}$ and $5.10^{21}$ atoms per cubic centimeter.

In another aspect, the invention features a method for manufacturing a photovoltaic or light detecting device. Such a method includes exposing a first side of a substrate to a beam of chalcogen ions to form a chalcogen-doped active layer; illuminating the first side with a series of short pulses of laser light to melt the surface and to allow the surface to re-solidify between pulses; and forming electrical contacts on the active layer and on the substrate.

Among the practices of the method are those in which exposing the first side of the substrate includes exposing the substrate to a dose of between $1.10^{13}$ and $5.10^{16}$ chalcogen ions per square centimeter, and in particular $5.10^{14}$ chalcogen ions per square centimeter, those in which exposing the first side to a beam of chalcogen ions includes selecting a dosage of chalcogen ions such that the concentration of chalcogen atoms in the active layer is sufficient to cause electrical activity in response to exposure to infrared photons, and those in which exposing the first side to a beam of chalcogen ions includes selecting a dosage of chalcogen ions such that the concentration of chalcogen atoms in the active layer is between about $10^{18}$ and $5.10^{21}$ chalcogen atoms per cubic centimeter.

Additional practices of the method are those in which illuminating the first side includes illuminating the first side with a series of laser pulses, each of which has a duration of between 1 ns and 50 ns.

Some practices of the method also include annealing the device.

In another aspect, the invention includes optical communication or range-finding system having an infrared laser; an optical detector for receiving light from the laser, the optical detector including a chalcogen-doped active layer on a substrate; and a receiver for receiving a signal from the optical detector, the signal being indicative of illumination by the infrared laser.

These and other features of the invention will be apparent from the following detailed description and the accompanying figures, in which:

DETAILED DESCRIPTION

Figure 1:
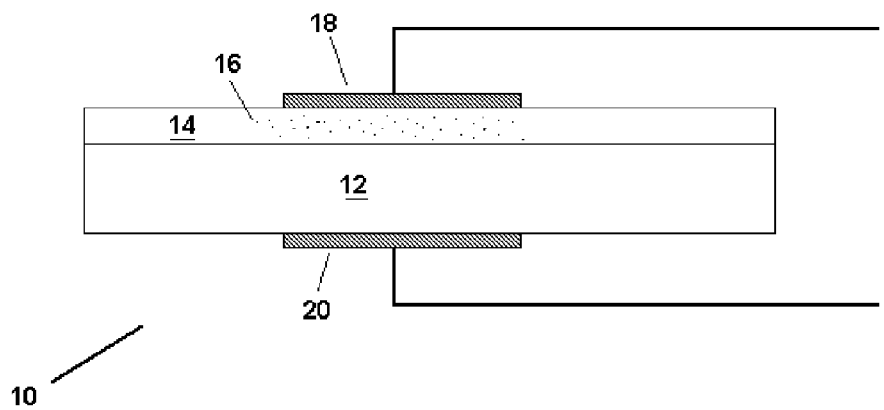
FIG. 1 shows a cross-section of a device.

Referring to FIG. 1, a semiconductor device 10 includes a substrate 12 having an active layer 14 doped with chalcogen atoms 16. First and second ohmic contacts 18, 20 are disposed on a surface of the active layer 14 and a surface of the substrate 12 respectively. In response to illumination, a voltage difference exists between the first and second contacts.

The substrate 12 is typically silicon, but can be made of another semiconductor, such as germanium.

The active layer 14 is typically a single-crystal semiconductor layer, such as a silicon layer. Suitable dopants are sulfur, selenium, and combinations thereof. However, other dopant atoms in varying combinations can also be used.

The thickness of the active layer 14 and the concentration of dopants within it is selected to provide an electrical response to photons incident on the active layer 14.

In some embodiments, the thickness and dopant concentration are selected to cause electrical activity in response to photons having wavelengths on the order of 1250 nm. In some embodiments, the thickness and dopant concentration is selected to cause electrical activity in response to photons having wavelengths at or less than 1250 nm, for example between 700 nm and 1250 nm. In other embodiments, the thickness and dopant concentration are selected to electrically respond to illumination by photons having wavelengths in a range that extends between n and (n+50 nm) for n=700 nm to 1300 nm in steps of 10 nm. The foregoing ranges thus include the ranges [700 nm,750 nm], [710 nm,760 nm], [710 nm, 770 nm] . . . [1300 nm, 1350 nm] and all combinations thereof.

A suitable active layer 14 is one that is less than 500 nm thick, and preferably between 50 nm and 500 nm thick. A particularly useful thickness is a 300 nm thickness. Other useful ranges of thickness are those between n and n+m where n ranges from 20 nm to 600 nm and m ranges from 1 nm to 100 nm in steps of 1 nm. Also useful are ranges formed by the union of any two or more of the foregoing ranges.

A suitable concentration of chalcogen atoms is approximately 1 atomic percent. Another suitable concentration is between about $10^{17}$ and $5.10^{21}$ chalcogen atoms per cubic centimeter.

Suitable chalcogen atoms include sulfur and selenium, either separately or mixed together. When mixed together, a 50/50 mixture of sulfur and selenium atoms has been found to be effective at causing electrical activity in response to illumination by photons.

To make the active layer 14, one implants dopant ions using an ion beam. A suitable ion implantation dose is between about $1.10^{13}$ and $5.10^{16}$ chalcogen ions per square centimeter of the surface of the active layer 14 Some embodiments have active layers subjected to a dose of $1.10^{16}$ sulfur ions per square centimeter, $1.10^{16}$ selenium ions per square centimeter, and $2.10^{16}$ ions consisting of a mixture of silicon and selenium ions in equal proportions per square centimeter.

Ion implantation tends to damage the surface of the active layer 14. To repair the surface, one illuminates the surface with a sequence of pulses from a pulsed laser beam. This tends to locally melt the surface, allowing the dopant to integrate into the crystal. Re-solidification of the melted surface tends to repair the damage caused by the ion beam.

The use of a series of short pulses is important for the procedure because a short pulse encourages fairly rapid re-solidification. This tends to retard the escape of dopant atoms that tends to occur while the active layer 14 is still liquid. A suitable laser is a nanosecond pulsed XeCl laser that melts an ion implantation region in the active layer 14. Suitable pulse lengths are between 1 and 50 ns, and especially between 30 and 40 ns. A particularly suitable pulse length is 30 ns. Additional ranges of pulse lengths are those extending from n to n+m, with n ranging from 1 ns to 75 ns, and m=1 ns. Also included among suitable ranges are unions of any two or more of the foregoing ranges.

The device 10, which now has a PN junction within it, is then subjected to an optional annealing at a temperature between 200 C and 600 C for about 30 minutes. Suitable anneal temperatures are 250 C, 400 C, and 550 C. Also suitable are temperatures in the intervals extending from T to T+ΔT, where T ranges from 200 to 600 in steps of 1 and ΔT ranges from 10 to 200 in steps of 10. Also suitable are temperatures in intervals formed by the union of any two or more of the foregoing intervals.

Following the optional annealing step, or directly after the laser melting procedure, one places contacts 18, 20 on the active layer 14 and on the substrate 14. Suitable contact materials are titanium, nickel, silver, and aluminum. This deposition is carried out by electron beam evaporation. While the particular size and shape of the contact is not critical, a suitable contact is one that is interdigitated on the active layer and square on the substrate with a side of length 20 nm and depth of 200 nm.

Figure 2:
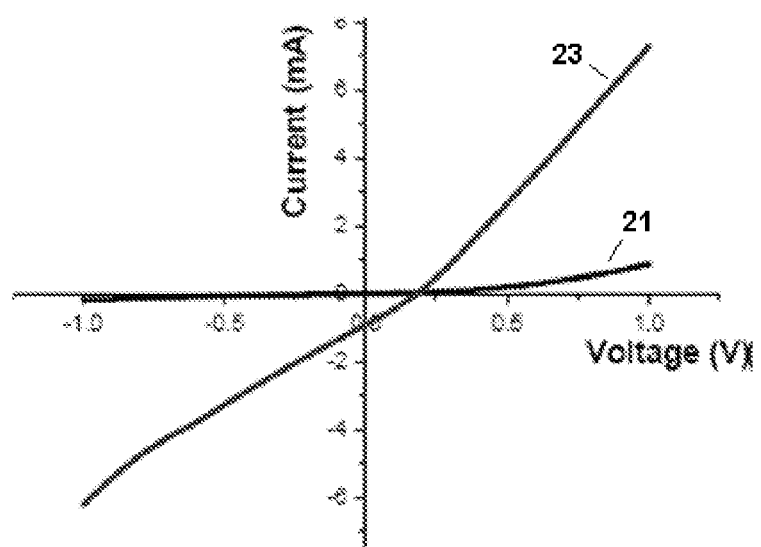
FIG. 2 shows a voltage/current characteristic of the device of FIG. 1.

Once completed, a typical device 10 has VI (voltage/current)characteristics as shown in FIG. 2. A first curve 21 shows the VI characteristic in the absence of illumination and a second curve 23 shows the VI characteristic when the device is illuminated by photons.

Figure 3:
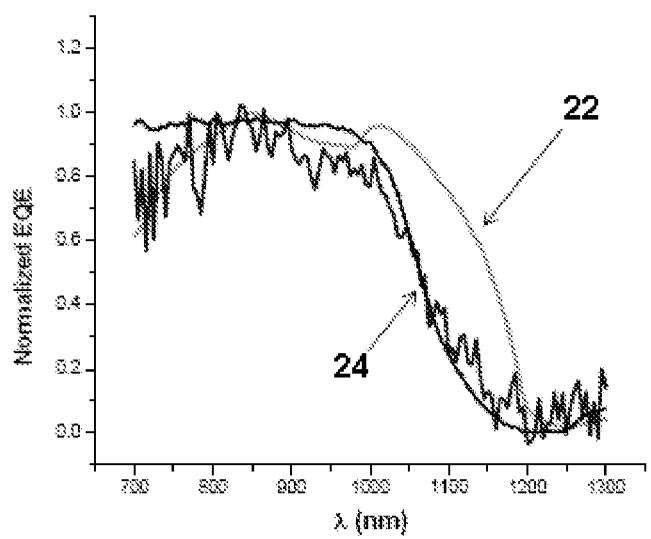
FIG. 3 compares normalized external quantum efficiency of the device of FIG. 1 across a range of wavelengths with that of a commercially available silicon photodiode.

FIG. 3 compares the normalized external quantum efficiency for the two devices doped as described above, one subject to annealing at 250 C and the other not subjected to annealing, both of which are biased at 12V. The two devices 10 have a silicon substrate doped with $10^{16}$ sulfur atoms per square centimeter. The external quantum efficiency of each device is compared to that of a commercially available silicon photodiode, also biased at 12V, across a range of frequencies.

As is apparent from the figure, the external quantum efficiency of a commercially available silicon photodiode (curve 24) drops rapidly as wavelength exceeds 1000 nm, whereas that of the device 10 (curve 22) not subjected to annealing remains greater than that of the commercially available silicon photodiode between about 1000 nm and about 1200 nm.

Figure 4:
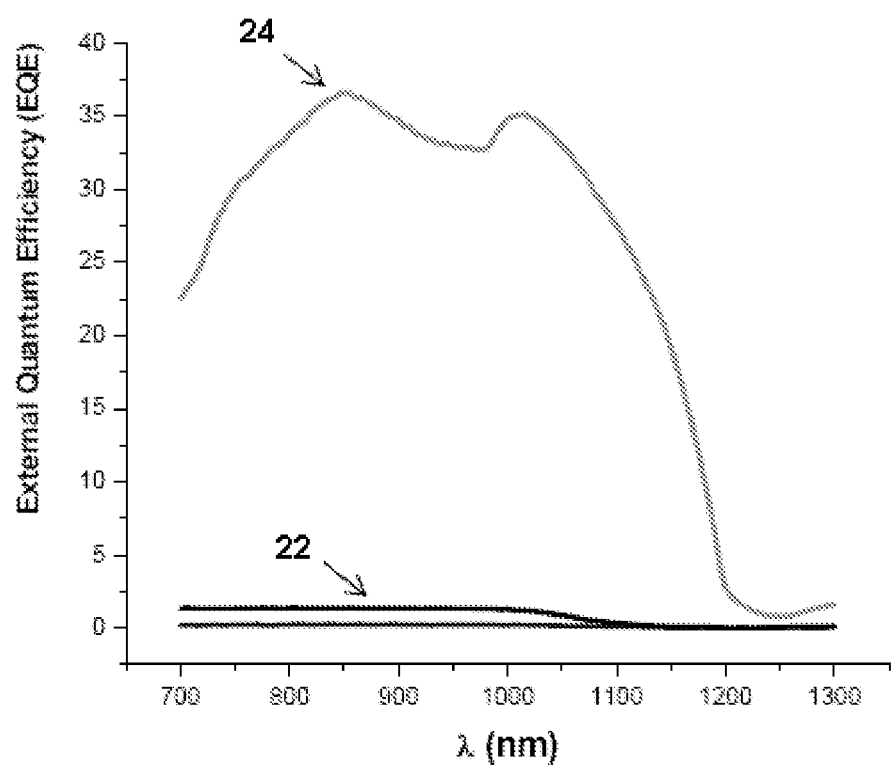
FIG. 4 shows the absolute external quantum efficiency corresponding to FIG. 3.

FIG. 4 shows the absolute external quantum efficiency corresponding to the normalized external quantum efficiency shown in FIG. 3. As is apparent, the external quantum efficiency of a device 10 as disclosed herein (curve 24) is greater than that of a commercially available silicon photodiode (curve 22) for the entire wavelength band from 700 nm to 1250 nm. Moreover, from 1100 nm to 1250 nm, where the conventional silicon photodiode has very low external quantum efficiency, the device 10 manages to maintain considerable external quantum efficiency.

Figure 5:
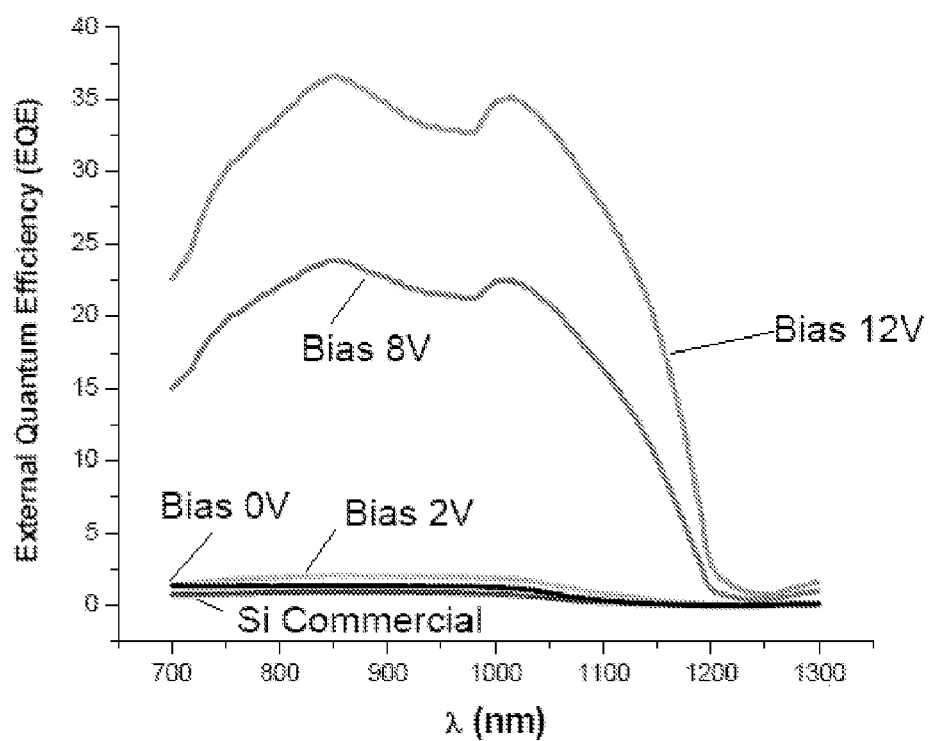
FIG. 5 shows external quantum efficiency across a band of wavelengths for different bias voltage levels.

FIG. 5 shows the external quantum efficiency of the device 10 from FIGS. 3 and 4 that was not subject to annealing for several different bias levels. As is readily apparent, the external quantum efficiency and the bandwidth of the device 10 depend strongly on applied bias.

The devices and methods described herein have a number of advantages. In particular, a silicon-based optoelectronic device having a chalcogen-rich single crystalline active layer exhibits an optical response and a high gain in a wide range of wavelengths, including in the infrared. In some cases, such devices may use little power and generate minimal heat during operation. With the methods described herein, the thickness and doping concentration of the active layer can be precisely controlled, enabling the performance of the device to be tuned and optimized. In general, silicon-based optoelectronic devices can be readily integrated with other silicon-based integrated circuits and other electronic components to form complex optoelectronic systems.

Figure 6:
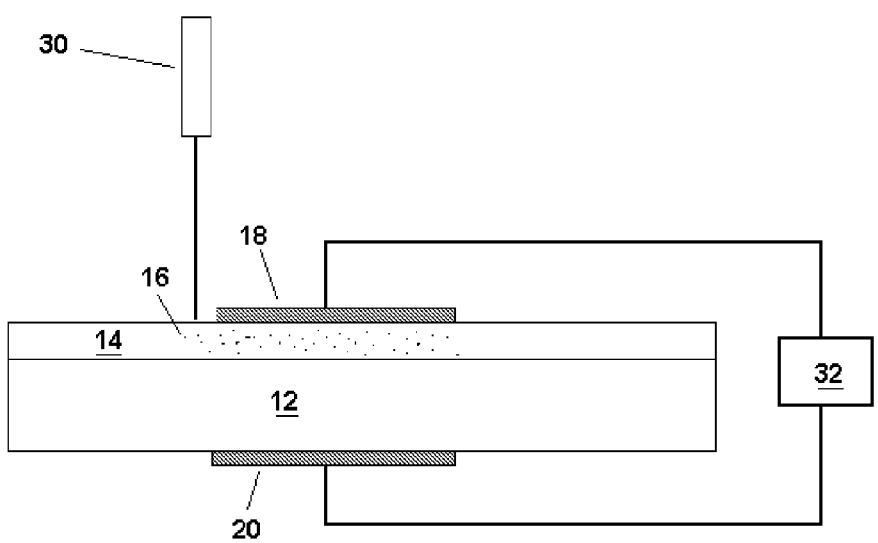
FIG. 6 shows an optical communication system incorporating the device of FIG. 1.

Devices as described herein can also be used with a detector 32 in an optical communication or rangefinding system, such as that shown in FIG. 6. Many such optical communication systems rely on particular lasers that radiate at particular wavelengths. Among the more popular of these lasers is the Nd:Yag laser 30, which radiates a beam at 1064 nm. Known silicon optoelectronic detectors do not respond efficiently at these wavelengths.

In known optoelectronics devices, it is possible to compensate for lack of external quantum efficiency in the infrared by making the substrate thicker. However, doing so comes at the cost of increasing response time. The device as described herein has sufficiently external quantum efficiency at infrared wavelengths to avoid the need to have a thicker device, and accordingly, avoids the trade-offs associated with such a device.

Having described the invention, and a preferred embodiment thereof, what we claim as new, and secured by Letters Patent is:

1. A manufacture having an electrical response to incident photons, said manufacture comprising:
    a semiconductor substrate;
    a chalcogen-doped semiconductor active layer on a first side of said substrate;
    a first contact in electrical contact with said active layer; and
    a second contact in electrical contact with said substrate;
    wherein, photons incident upon said active layer cause a variation in current between said first and second contacts.
2. The manufacture of claim 1, wherein said active layer is a single-crystal semiconductor.
3. The manufacture of claim 1, wherein said active layer has a thickness between 50 nm and 500 nm.
4. The manufacture of claim 1, wherein said active layer is silicon.
5. The manufacture of claim 1, wherein said photons incident upon said active layer include infrared photons.
6. The manufacture of claim 1, wherein said photons incident upon said active layer have wavelengths above 1050 nm.
7. The manufacture of claim 1, wherein said active layer is doped with sulfur.
8. The manufacture of claim 1, wherein said active layer is doped with selenium.
9. The manufacture of claim 1, wherein said active layer is doped with a combination of sulfur and selenium.
10. The manufacture of claim 1, wherein said active layer is doped with different types of atoms.
11. The manufacture of claim 1, wherein the active layer is doped to have 1 atomic percent of chalcogen atoms.
12. The manufacture of claim 1, where the active layer is doped to have in excess of 1 atomic percent of chalcogen atoms.
13. The manufacture of claim 1, wherein the active layer has a concentration of chalcogen atoms within the range of $10^{18}$ and $5.10^{21}$ atoms per cubic centimeter.
14. A method for manufacturing a photovoltaic or light detecting device, said method comprising:
    exposing a first side of a substrate to a beam of chalcogen ions to form a chalcogen-doped active layer;
    illuminating said first side with a series of short pulses of laser light to melt the surface and to allow the surface to re-solidify between pulses; and
    forming electrical contacts on said active layer and on said substrate.
15. The method of claim 14, wherein exposing the first side of the substrate comprising exposing the substrate to a dose of between $1.10^{13}$ and $5.10^{16}$ chalcogen ions per square centimeter.
16. The method of claim 14, wherein exposing the first side of the substrate comprising exposing the substrate to a dose of about $1.10^{14}$ chalcogen ions per square centimeter.
17. The method of claim 14, wherein exposing the first side to a beam of chalcogen ions comprises selecting a dosage of chalcogen ions such that the concentration of chalcogen atoms in the active layer is sufficient to cause electrical activity in response to exposure to infrared photons.
18. The method of claim 14, wherein exposing the first side to a beam of chalcogen ions comprises selecting a dosage of chalcogen ions such that the concentration of chalcogen atoms in the active layer is between about $10^{18}$ and $5.10^{21}$ chalcogen atoms per cubic centimeter.
19. The method of claim 14, wherein illuminating said first side comprises illuminating said first side with a series of laser pulses, each of which has a duration of between 1 ns and 50 ns.
20. The method of claim 14, further comprising annealing the photovoltaic device.
21. An apparatus for use in optical communication or rangefinding, said apparatus comprising
    an infrared laser;
    an optical detector for receiving light from said laser, said optical detector including a chalcogen-doped active layer on a substrate; and
    a receiver for receiving a signal from said optical detector, said signal being indicative of illumination by said infrared laser.

* * * * *